United States Patent [19]

Moore et al.

[11] Patent Number: 5,723,238
[45] Date of Patent: Mar. 3, 1998

[54] INSPECTION OF LENS ERROR ASSOCIATED WITH LENS HEATING IN A PHOTOLITHOGRAPHIC SYSTEM

[75] Inventors: Bradley T. Moore; Robert Dawson; H. Jim Fulford, Jr., all of Austin; Mark I. Gardner, Cedar Creek; Frederick N. Hause, Austin; Mark W. Michael, Cedar Park; Derick J. Wristers, Austin, all of Tex.

[73] Assignee: Advanced Micro Devices, Inc., Sunnyvale, Calif.

[21] Appl. No.: 760,028

[22] Filed: Dec. 4, 1996

[51] Int. Cl.$^6$ .................................................. G03C 5/00
[52] U.S. Cl. .......................... 430/30; 430/323; 430/394; 430/329; 216/59; 216/84; 356/390
[58] Field of Search ........................... 430/323, 30, 329, 430/394; 356/390; 216/59, 84

[56] References Cited

U.S. PATENT DOCUMENTS

| | | | |
|---|---|---|---|
| 4,585,342 | 4/1986 | Lin et al. | 356/124 |
| 4,759,626 | 7/1988 | Kroko | 356/124 |
| 4,794,426 | 12/1988 | Nishi | 355/43 |
| 5,308,991 | 5/1994 | Kaplan | 250/492.22 |
| 5,309,197 | 5/1994 | Mori et al. | 355/53 |
| 5,329,334 | 7/1994 | Yim et al. | 355/53 |
| 5,402,224 | 3/1995 | Hirukawa et al. | 356/124 |
| 5,451,479 | 9/1995 | Ishibashi | 430/322 |
| 5,572,288 | 11/1996 | Mizutani | 355/53 |

*Primary Examiner*—George F. Lesmes
*Assistant Examiner*—Laura Weiner
*Attorney, Agent, or Firm*—Skjerven, Morrill, MacPherson, Franklin & Friel LLP; David M. Sigmond

[57] ABSTRACT

A method of inspecting a lens includes projecting a first amount of radiation through a first test pattern and the lens to provide a first lens error associated with a first heating of the lens, projecting a second amount of radiation through a second test pattern and the lens to provide a second lens error associated with a second heating of the lens, and using the first and second lens errors to provide image displacement data that varies as a function of heating the lens. In this manner, corrections can be made for localized lens heating that is unique to a given reticle. The method is well-suited for photolithographic systems such as step and repeat systems.

30 Claims, 6 Drawing Sheets

LOW TEMPERATURE

HIGH TEMPERATURE

INSPECTION OF LENS ERROR ASSOCIATED WITH LENS HEATING IN A PHOTOLITHOGRAPHIC SYSTEM

BACKGROUND OF THE INVENTION

1. Field of the Invention

The present invention relates to inspecting lens errors (including distortion, astigmatism, and the like), and more particularly to inspecting lens errors as a function of lens heating in photolithographic systems used for fabricating integrated circuit devices.

2. Description of Related Art

Integrated circuit device fabrication requires that precisely controlled quantities be introduced into or deposited onto tiny regions of a wafer or substrate. Photolithography is typically used to create patterns that define these regions. That is, photoresist is spin-coated onto the wafer, selectively exposed to radiation, and then developed. If positive photoresist is used then the developer removes the irradiated regions, whereas if negative photoresist is used then the developer removes the non-irradiated regions. After the photoresist is patterned, the wafer is subjected to an additive process (such as ion implantation) or a subtractive process (such as etching) using the photoresist as a mask.

Photolithographic systems typically use a radiation source and a lens in conjunction with a mask or reticle to selectively irradiate the photoresist. The radiation source projects radiation through the mask or reticle to the lens, and the lens focuses an image of the mask or reticle onto the wafer. A mask transfers a pattern onto the entire wafer (or another mask) in a single exposure step, whereas a reticle transfers a pattern onto only a portion of the wafer. Step and repeat systems transfer multiple images of the reticle pattern over the entire wafer using multiple exposures. The reticle pattern is typically 2× to 10× the size of the image on the wafer, due to reduction by the lens. However, non-reduction (1×) steppers offer a larger field, thereby allowing more than one pattern to be printed at each exposure.

The reticle is typically composed of quartz with relatively defect-free surfaces and a high optical transmission at the radiation wavelength. Quartz has a low thermal expansion coefficient and high transmission for near and deep ultraviolet light. Although quartz tends to be expensive, it has become more affordable with the development of high quality synthetic quartz material.

The reticle is prepared by cutting a large quartz plate which is polished and cleaned, and then coated with a mask forming material such as chrome or iron oxide. Chrome is the most widely used material and is typically deposited by sputtering or evaporation to a thickness of less than 1,000 angstroms. The chrome is then selectively removed to form the pattern. For instance, a very thin layer of photoresist is deposited on the chrome and patterned (either optically or by an electron beam) by imaging and exposing a set of accurately positioned rectangles, and then a wet etch is applied. Patterning the reticle for a complex VLSI circuit level may require in excess of 100,000 rectangle exposures over a 10 hour period. During this period, extreme temperature control is often necessary to prevent positional errors. As a result, the quality of the reticle cannot be ascertained until after the chrome is etched.

Lens errors in step and repeat systems are highly undesirable since they disrupt the pattern transfer from the reticle to the photoresist, which in turn introduces flaws into the integrated circuit manufacturing process. Lens errors include a variety of optical aberrations, such as astigmatism and distortion. Astigmatism arises when the lens curvature is irregular. Distortion arises when the lens magnification varies with radial distance from the lens center. For instance, with positive or pincushion distortion, each image point is displaced radially outward from the center and the most distant image points are displaced outward the most. With negative or barrel distortion, each image point is displaced radially inward toward the center and the most distant image points are displaced inward the most. Accordingly, the lens error is frequently measured so that corrections or compensations can be made.

A typical technique for evaluating lens errors includes performing a photoresist exposure and development using specially designed mask patterns to be used for evaluation purposes. After such an imaging process, the wafer is either subjected to an optical inspection or is further processed to form electrically measurable patterns. The use of photosensitive detectors fabricated on silicon to monitor optical systems is also known in the art.

U.S. Pat. No. 4,585,342 discloses a silicon wafer with radiation sensitive detectors arranged in a matrix, an x-y stage for positioning the wafer so that each one of the detectors is separately disposed in sequence in the same location in the field of projected radiation, and a computer for recording the output signals of the detectors in order to calibrate the detectors prior to evaluating the performance of an optical lithographic system.

U.S. Pat. No. 5,308,991 describes predistorted reticles which incorporate compensating corrections for known lens distortions. Lens distortion data is obtained which represents the feature displacement on a wafer as a function of the field position of the lens. The lens distortion data is used to calculate x and y dimensional corrections terms. The inverted correction terms are multiplied by a stage controller's compensation value to correctly position the reticle. In this manner, the reticle is positioned to compensate for the lens error.

U.S. Pat. No. 5,402,224 provides distortion inspection of an optical system by providing a test reticle with a measurement pattern arranged at a predetermined interval Sx, transferring a the pattern from a test reticle to a photosensitive substrate, shifting the test reticle and the substrate relative to one another by $\Delta Tx$ (where $\Delta Tx < Sx$), transferring measurement pattern again from the test reticle to the substrate, measuring the relative displacement between the two formed patterns to provide differential coefficients on distortion characteristics, and integrating the differential coefficients to provide the distortion characteristics.

A shortcoming of the aforementioned approaches is that they fail to characterize the lens error as a function of lens heating. Reticles often have unique patterns that expose some lens portions to far more radiation than others. Since the radiation has high intensity and the lens has low thermal conductivity, a portion of the lens subjected to a large amount of radiation is likely to get far hotter than a portion of the lens subjected to little or no radiation. Therefore, the particular reticle dictates the pattern of localized lens heating. Furthermore, since the lens has a given thermal coefficient of expansion, the lens dimensions change as a function of lens heat. Accordingly, the lens error arises not only from inherent lens flaws, but also from lens heating. Moreover, the lens error associated with lens heating depends on the specific reticle pattern.

Accordingly, a need exists for inspecting lens errors associated with lens heating so that corrective measures can be taken for particular reticles.

SUMMARY OF THE INVENTION

An object of the invention is a method of inspecting a lens to determine a lens error associated with lens heating. Another object is to provide a lens inspection technique for photolithographic systems such as step and repeat systems.

In accordance with one aspect of the invention, a method of inspecting a lens includes projecting a first amount of radiation through a first test pattern and the lens to provide a first lens error associated with a first heating of the lens, projecting a second amount of radiation through a second test pattern and the lens to provide a second lens error associated with a second heating of the lens, and using the first and second lens errors to provide image displacement data that varies as a function of heating the lens. Preferably, the second amount of radiation is substantially greater than the first amount of radiation, which causes the second heating of the lens to be substantially greater than the first heating of the lens.

The preferred embodiment includes projecting radiation through the first test pattern to form a first image pattern in a first portion of photosensitive material on a wafer, projecting radiation through the second test pattern to form a second image pattern in a second portion of the photosensitive material, developing the photosensitive material to expose selected portions of the wafer, etching the wafer using the photosensitive material as an etch mask to form first and second transfer patterns in the wafer, stripping the photoresist, measuring the first and second transfer patterns, calculating the first lens error using the first test pattern and the first transfer pattern, and calculating the second lens error using the second test pattern and the second transfer pattern.

Preferably, the first test pattern consists of an isolated pattern of transparent lines that transfers less than 10 percent of the radiation projected at the first test reticle, and the second test pattern consists of dense pattern of transparent lines that transfers at least 80 percent of the radiation projected at the second reticle. Both test patterns can include repeating patterns of short transparent lines that extend in both the x and y directions. Furthermore, the second test pattern can include transparent lines with line widths and line spacings corresponding to the minimum resolution of a photolithographic system to simulate lens heating for gate definition portions of a reticle.

Advantageously, the image displacement data can be function of both position on the lens surface and localized heating of the lens. For instance, for pairs of x and y coordinates on the lens surface, a first image displacement corresponding to the first lens heating and a second image displacement corresponding to the second lens heating can be provided. This facilitates correction of both inherent lens errors and lens heating errors. In this manner, once a reticle pattern is known, corrections can be made for localized lens heating that is unique to that reticle.

These and other objects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1:
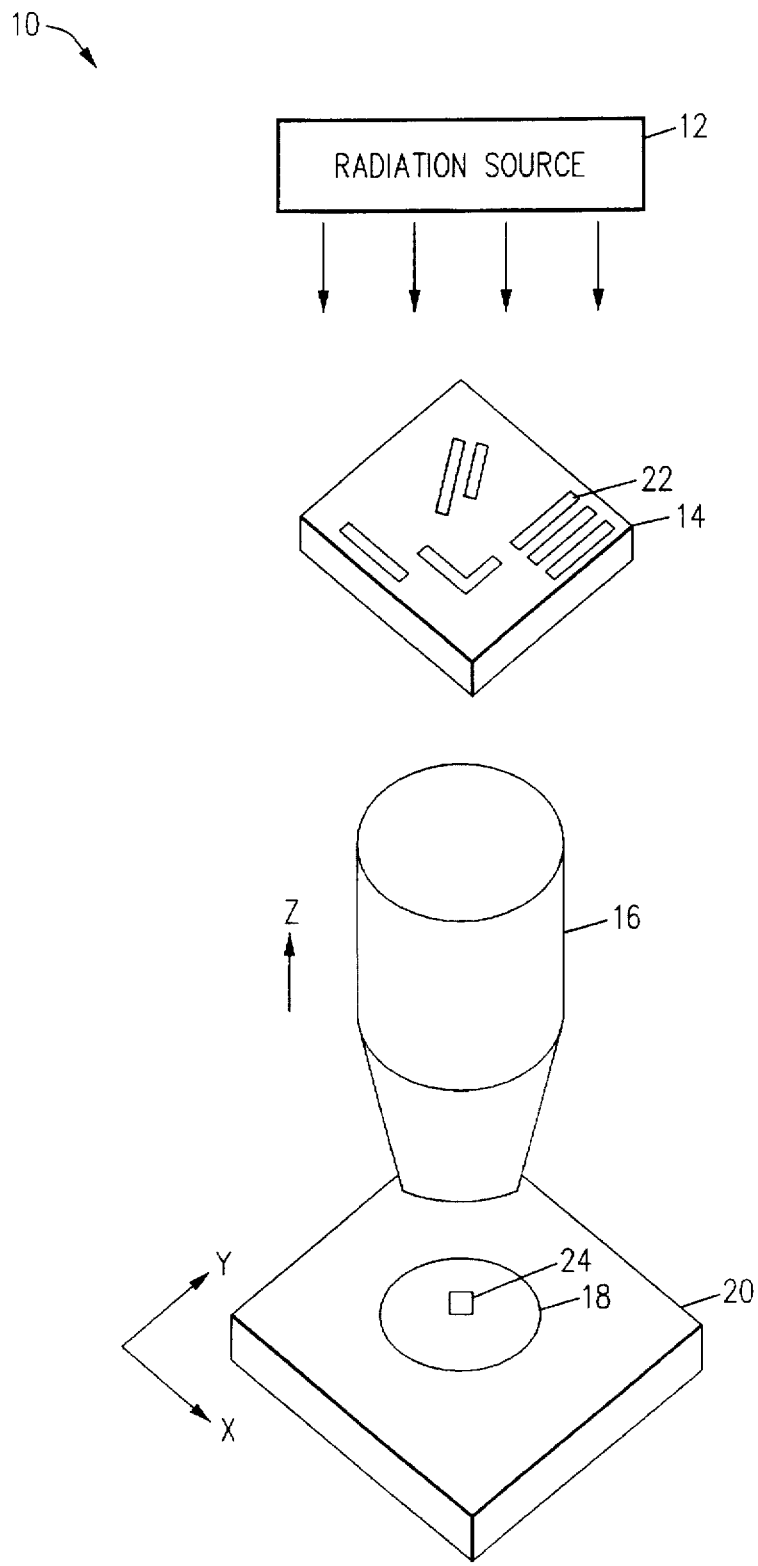
FIG. 1 is a perspective view showing a typical arrangement of a step and repeat system.

In the drawings, depicted elements are not necessarily drawn to scale and like or similar elements may be designated by the same reference numeral throughout the several views.

FIG. 1 is a perspective view showing a typical arrangement of a step and repeat system for fabricating integrated circuit devices. System 10 includes radiation source 12, reticle 14, lens 16, and wafer 18 mounted on x-y stepping table 20. Radiation source 12 includes a mercury-vapor lamp for generating I-line ultraviolet light. Reticle 14 includes a chrome pattern on a quartz base, with optically transparent lines 22 between regions of chrome for transferring a radiation pattern. Lens 16 focuses the radiation pattern onto portion 24 of photoresist-coated wafer 18. A computer (not shown), which is a standard digital data processor, controls the motion of stepping table 20 in the x-y direction for step and repeat operation, and the motion of lens 16 in the z direction for focusing the radiation pattern. Mechanisms to move the reticle, lens, and wafer in the x, y or z directions in response to electrical control signals are well-known in the art.

Figure 2:
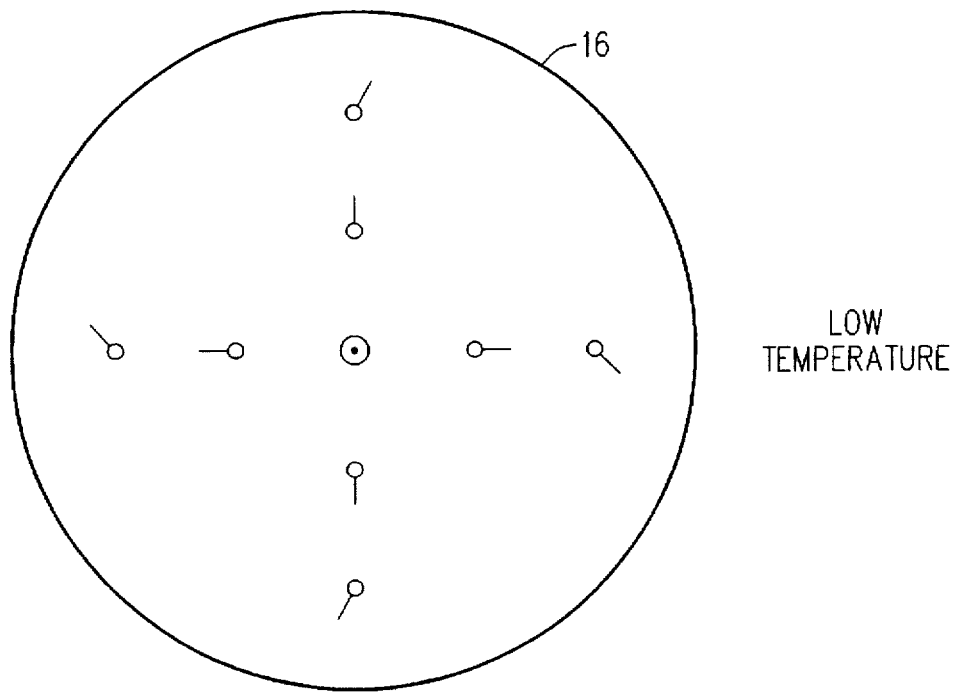
FIGS. 2 and 3 are pictorial representations of lens errors from different amounts of lens heating.
Figure 3:
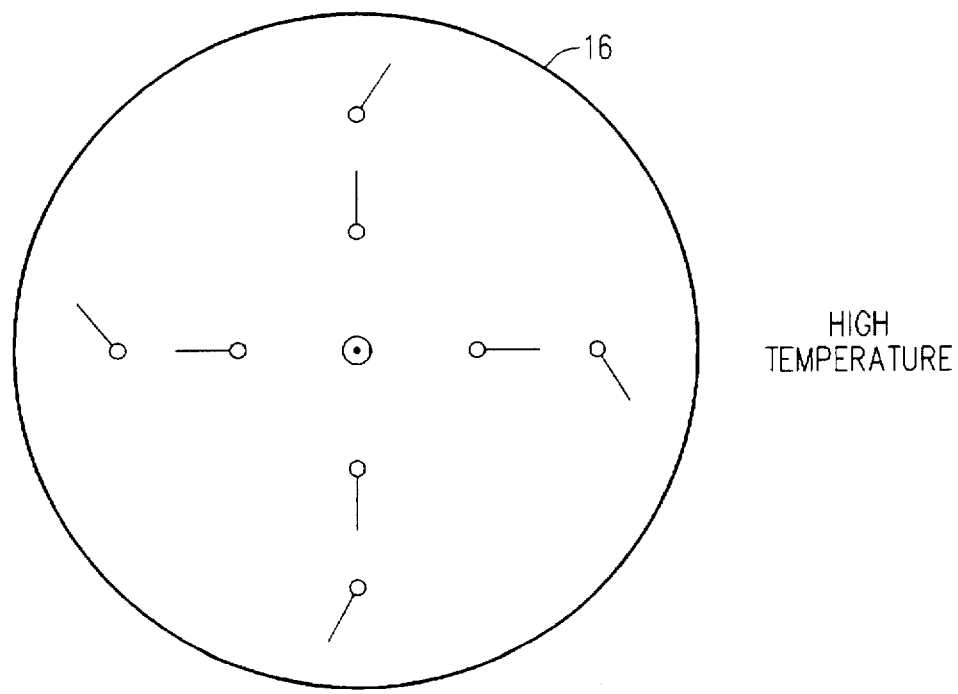

FIGS. 2 and 3 are pictorial representations of lens errors in lens 16 for varying amounts of lens heating. The small circles represent points (defined by x and y coordinates) on the bottom lens surface through which radiation passes. The lines associated with the circles represent the lens error at that point on the lens surface. The length of the line corresponds to the magnitude of the error, while the direction of the line corresponds to the direction in which the image is displaced. FIG. 2 represents the lens error for lens 16 at a low temperature, whereas FIG. 3 represents the lens error for lens 16 at a high temperature. As is seen, the lens error is a function of the lens heating.

Figure 4:
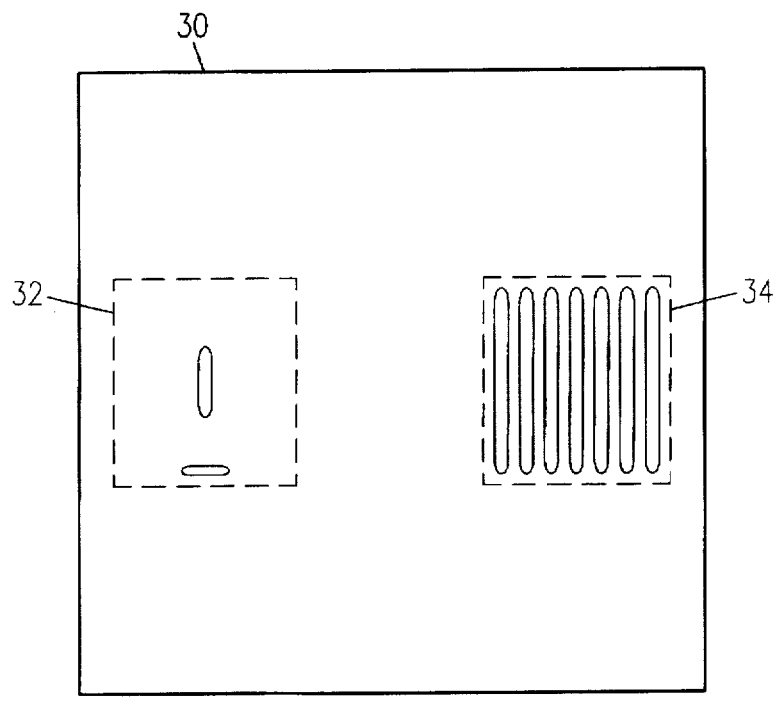
FIG. 4 is a top plan view of a reticle used for patterning an integrated circuit device.

FIG. 4 is a top plan view of a reticle used for patterning a layer of an integrated circuit device. Reticle 30 includes a first portion 32 with an isolated pattern of optically transparent lines, and a second portion 34 with a dense pattern of optically transparent lines. The lines in first portion 32 are widely spaced from adjacent lines, whereas the lines in portion 34 are in close proximity to adjacent lines. All the lines have a similar line width, for instance corresponding to the minimum resolution of system 10. Thus, second portion 34 transfers a far greater amount of radiation than first portion 32.

Figure 5:
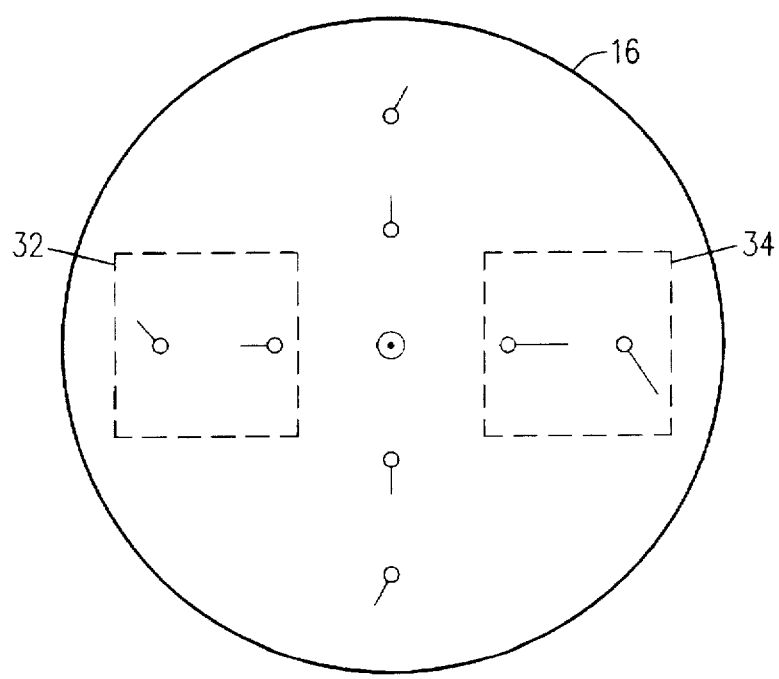
FIG. 5 is a pictorial representation of the lens error associated with the reticle of FIG. 4.

FIG. 5 is a pictorial representation of the lens error in lens 16 when reticle 30 is used. As is seen, the portion of lens 16 aligned with portion 32 of reticle 30 undergoes little localized heating and therefore corresponds to the lens error of FIG. 3, whereas the portion of lens 16 aligned with portion 34 of reticle 30 undergoes extreme localized heating and therefore corresponds to the lens error of FIG. 4. The portions of lens 16 outside portions 32 and 34 of reticle 30, which receive little or no localized heating, also correspond to the lens error of FIG. 3. Thus, the lens error for lens 16 is a function of localized lens heating that depends on the reticle pattern employed.

Inspecting a lens error associated with reticle 30, or other reticles used for fabricating integrated circuit devices, can be pursued by measuring a transfer pattern for the reticle, comparing the transfer pattern with the reticle pattern, and then calculating the lens error for the reticle. A drawback to this approach, however, is that the reticle pattern is normally not designed to facilitate inspecting the lens. For instance, a reticle pattern with long lines running predominantly in one direction may provide very limited information about image displacement in the direction of the lines. Furthermore, the reticle pattern may be difficult to measure at the desired coordinates.

Figure 6:
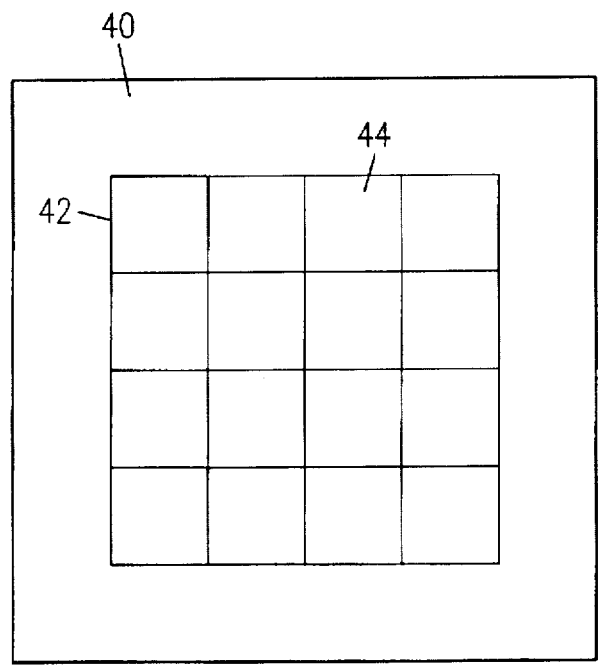
FIGS. 6 and 7 are top plan views of first and second test reticles with first and second test patterns for inspecting a lens error.
Figure 7:
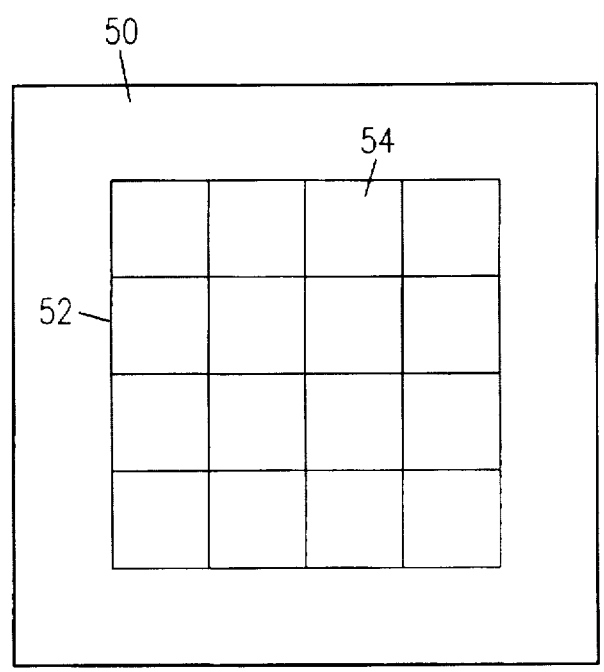

FIGS. 6 and 7 are top plan views of first and second test reticles with first and second test patterns for inspecting a lens error. First test reticle 40 includes first test pattern 42 that consists of an isolated (sparse) pattern of optically transparent lines (not shown), and second test reticle 50 includes second test pattern 52 that consists of a dense pattern of optically transparent lines (not shown). For illustration purposes, first test pattern 42 is arranged as a 4×4 array of uniform repealing patterns such as repeating pattern 44, and second test pattern 52 is arranged as a 4×4 array of uniform repeating patterns such as repeating pattern 54, although the repeating patterns are typically far larger in number and smaller in size (i.e., a 100×100 array). Preferably, reticles 40 and 50 are constructed with a chrome pattern on a quartz base.

Figure 8:
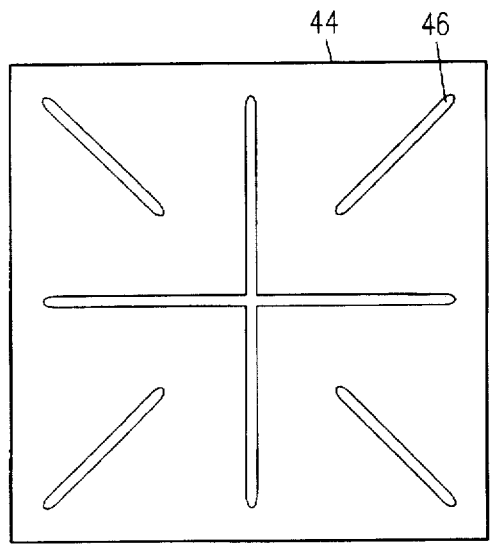
FIGS. 8 and 9 are top plan views of repeating patterns within the first and second test patterns.
Figure 9:
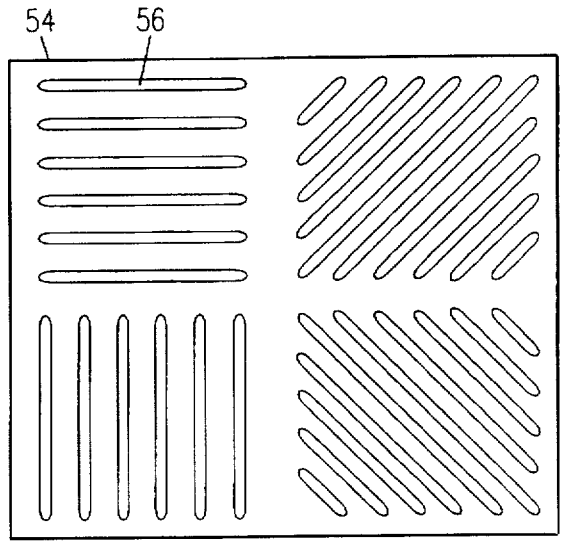

FIGS. 8 and 9 are top plan views of the repeating patterns within the first and second test patterns. Repeating pattern 44 (within first test pattern 42) is composed of optically transparent lines 46, and repeating pattern 54 (within second test pattern 52) is composed of optically transparent lines 56. As is seen, lines 46 extend in both the x and y directions, and lines 56 extend in both the x and y directions. Lines 46 do not extend outside repeating pattern 44 and therefore are relatively short with respect to first test pattern 42, and lines 56 do not extend outside repeating pattern 54 and therefore are relatively short with respect to second test pattern 52. Moreover, the average spacing between adjacent ones of lines 46 is substantially greater than the average spacing between adjacent ones of lines 56.

Reticles 40 and 50 are adapted for providing first and second lens errors, respectively, that vary as a function of lens heating. In particular, reticle 40 is adapted to provide a first lens error associated with a small amount of lens heating, whereas reticle 50 is adapted to provide a second lens error associated with a large amount of lens heating. First test pattern 42 and second test pattern 52 are configured to provide information about the entire usable area of the lens being inspected.

Reticles 40 and 50 can be used in conjunction with step and repeat system 10. When reticle 40 is used, less than 10 percent of the radiation from source 12 that impinges upon reticle 40 is transferred to lens 16, and the optically transparent lines where the radiation is transferred are sparse and isolated. However, when reticle 50 is used, more than 80 percent of the radiation from source 12 that impinges upon reticle 50 is transferred to lens 16, and the optically transparent lines where the radiation is transferred are densely packed. Thus, reticle 50 transfers substantially more radiation density, and causes substantially more lens heating, than reticle 40.

In reticle 50, both the line widths and the line spacings of the optically transparent lines are similar to the minimum resolution of system 10. In this manner, reticle 50 simulates lens heating for the gate definition portion of a reticle, where precise feature placement is especially critical. The exact line widths and line spacings of the test reticles will depend on the photolithographic system's capabilities, and simple experimentation will reveal the optimum combination for a specific set of conditions. However, as the technology advances and smaller line widths and spacings can be printed, the lower limits of line width and spacing may be reduced.

Figure 10:
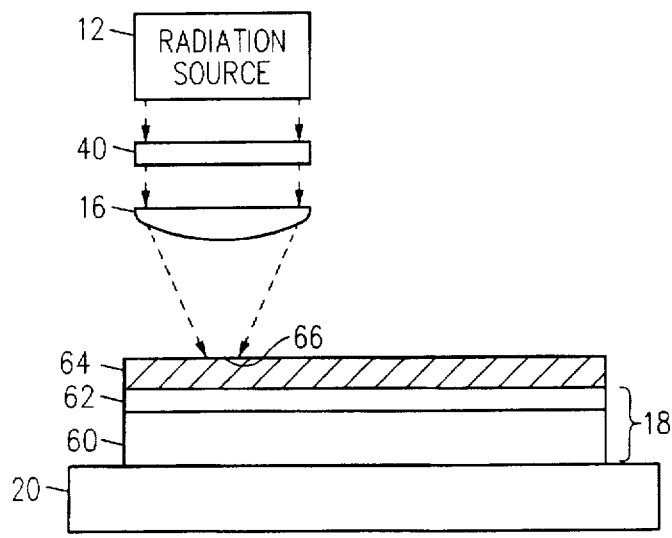
FIGS. 10 through 13 show cross-sectional views of successive steps for forming transfer patterns in a wafer using the first and second test patterns.

In FIG. 10, reticle 40 is positioned above lens 16. Wafer 18 includes silicon substrate 60 beneath a top layer of polysilicon 62. Normally an oxide layer (not shown) is sandwiched between polysilicon 62 and substrate 60. Photoresist 64 has been deposited on polysilicon 62, as is conventional prior to patterning polysilicon gate electrodes. However, in this instance, wafer 18 provides a test wafer in order to reduce lens errors during the fabrication of subsequent wafers. Stepping table 20 is actuated to align first portion 66 of photoresist 64 with lens 16. Radiation source 12 then projects radiation through reticle 40 and lens 16 to form a first image pattern (not shown), corresponding to first test pattern 42, on first portion 66 of photoresist 64. The portions of lens 16 exposed to the radiation from source 12 through reticle 40 are heated to a first temperature, but not a second temperature.

Figure 11:
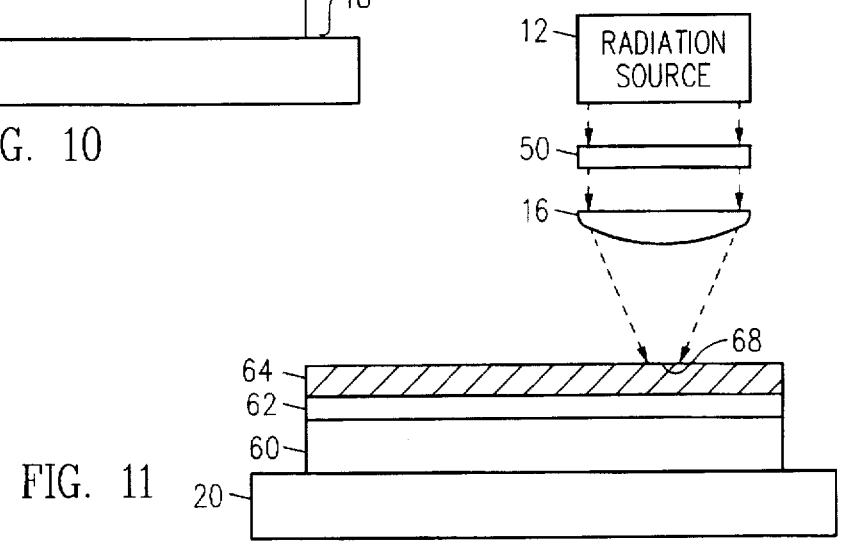

In FIG. 11, reticle 40 is retracted and reticle 50 is positioned above lens 16. In addition, stepping table 20 is actuated to align second portion 68 of photoresist 64 with lens 16. Radiation source 12 then projects radiation through reticle 50 and lens 16 to form a second image pattern (not shown), corresponding to second test pattern 52, on second portion 68 of photoresist 64. The portions of lens 16 exposed to the radiation from source 12 are heated to at least the second temperature.

Figure 12:
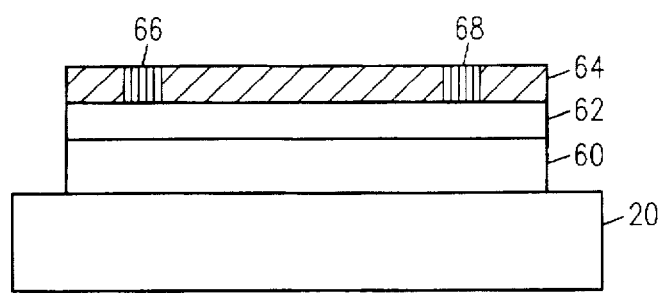

In FIG. 12, photoresist 64 is developed to selectively expose polysilicon 62. Since photoresist 64 is positive acting, the irradiated regions (defined by the image patterns) of portions 66 and 68 are removed from polysilicon 62, and the remaining photoresist remains intact. For ease of illustration, portions 66 and 68 are shown with vertical hatching, although in actuality the irradiated regions of portions 66 and 68 are removed.

Figure 13:
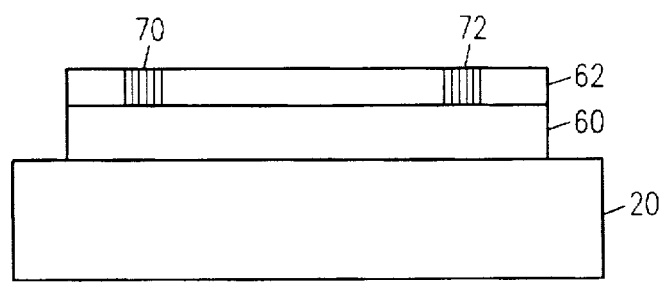

In FIG. 13, polysilicon 62 is etched using photoresist 64 as an etch mask. Preferably, an anisotropic dry etch is applied that is highly selective of polysilicon, as is conventional. Portions 70 and 72 of polysilicon 62 are directly beneath portions 66 and 68, respectively, of photoresist 64. After etching occurs, slits within portion 70 of polysilicon 62 form a first transfer pattern (not shown) associated with the first image pattern and the first test pattern, and slits within portion 72 of polysilicon 62 form a second transfer pattern (not shown) associated with the second image pattern and the second test pattern. Thus, the first and second transfer patterns are formed concurrently. Thereafter, the photoresist is shipped, and the first and second transfer patterns are measured, for instance using a scanning electron microscope as is well known in the art. For ease of illustration, portions 70 and 72 are shown with vertical hatching, although in actuality the etched regions of portions 70 and 72 are removed.

Figure 14:
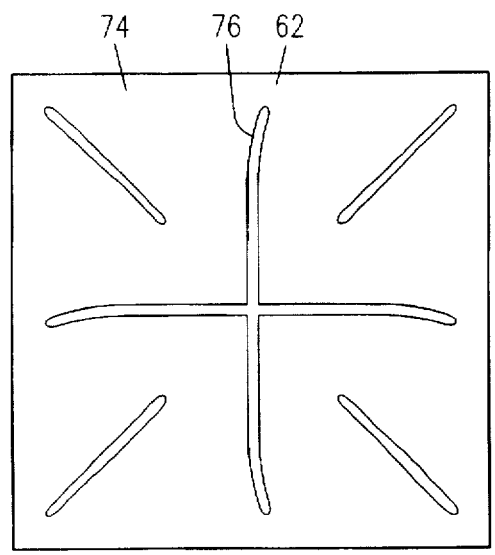
FIGS. 14 and 15 are top plan views of portions of the transfer patterns formed in the wafer resulting from the repeating patterns shown in FIGS. 8 and 9.
Figure 15:
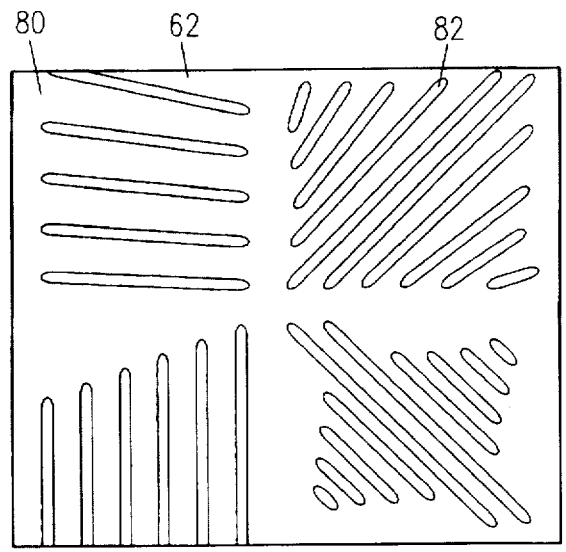

FIGS. 14 and 15 are top plan views of portions of the first and second transfer patterns, corresponding to repeating patterns 44 and 54, that are formed in polysilicon 62 after the etching occurs and are visible after photoresist 64 is shipped. In FIG. 14, portion 74 of the first transfer pattern is provided by slits 76 within portion 70 of polysilicon 62. In FIG. 15, portion 80 of the second transfer pattern is provided by slits 82 within portion 72 of polysilicon 62. After the first transfer pattern is measured, it is compared with the first test pattern to determine the first lens error. Likewise, after the second transfer pattern is measured, it is compared with the second test pattern to determine the second lens error. For instance, lines 46 (FIG. 8) are compared with slits 76 (FIG. 14), and lines 56 (FIG. 9) are compared with slits 82 (FIG. 15). As is seen, the correspondence between the lines 46 and slits 76 is significantly greater than the correspondence between lines 56 and slits 82. This reflects a significantly greater correspondence between the first test pattern and the first transfer pattern than between the second test pattern and the second transfer pattern. Thus, the first lens error is significantly smaller than the second lens error.

Preferably, the lens errors are expressed in terms of image displacement data which provides the image displacement or offset as a function of position on the lens (or exposure field). The lens position can be defined, for instance, as a radial distance from the center of the lens, or as (x,y) coordinates on the lens surface. If the lens position is a radial distance, then the image displacement ($\Delta r$) is a function of radial distance. Likewise, if the lens position is in (x,y) coordinates, then the image displacement ($\Delta x$, $\Delta y$) is a function of the (x,y) coordinates. Of importance, for each coordinate position on the lens surface, the image displacement data includes a first image displacement corresponding to the first lens heating, and a second image displacement corresponding to the second lens heating.

By way of example, the image displacement data obtained from the first lens error would be suitable for portion 32 of reticle 30, and the image displacement data obtained from the second lens error would be suitable for portion 34 of reticle 30. Furthermore, the image displacement data from the first and second lens errors can be interpolated or extrapolated as necessary. For instance, as a first approximation, one may assume a linear variation in lens error as a function of lens heating.

Additional lens errors can be obtained, for instance by using a third test reticle to obtain a third lens error, a fourth test reticle to obtain a fourth lens error, and so on. Moreover, separate lens errors can be obtained for separate layers on the wafer. Since reticle 40 transfers very little radiation, the first lens error should provide a baseline for most reticles. However, other layers such as overlaying metallization layers may have significantly wider line spacings than the gate electrodes, in which case a third test reticle which transfers significantly more radiation than reticle 50 might be useful.

If desired, multiple ones of the first and second image patterns can be formed in the photoresist in step and repeat fashion. After developing the photoresist and etching the wafer, multiple ones of the first and second transfer patterns can be measured, and these measurements can be evaluated using statistical analysis to determine the first and second lens errors. Statistical analysis may also be useful in evaluating the effects of residual heating (from previous exposures) on the lens errors. That is, since step and repeat exposures are often done rapidly, previous exposures may affect the lens heating and the lens errors. Statistical analysis for multiple exposures can be used, for instance, to provide image displacement data based on the lens heating from typical exposures, although the initial exposures may produce somewhat less lens heating.

The image displacement data can also be determined in conjunction with a focus-exposure matrix. For instance, once the focus-exposure matrix for the wafer (or another wafer) is obtained, the first and second lens errors can be obtained using the optimal focus and exposure parameters.

It should also be noted that the image displacement data provides corrective information about more than just lens heating errors. The image displacement data provides corrective information about inherent lens errors such as manufacturing defects. Furthermore, the image displacement data may provide corrective information about the photoresist, the topography of the wafer, or other factors that contribute to errors in the pattern transfer.

Once the image displacement data is obtained, several corrective measures can be taken. For instance, an intermediary corrective lens can be fabricated for a given reticle and disposed in the focal plane of the lens. Alternatively, a vacuum chuck can be provided to distort the wafer in accordance with a given reticle. Attempting to maintain uniform surface temperature on the lens is considered impractical. Likewise, replacing the lens in a step and repeat system is also considered impractical since the lens is a large, heavy, integral part of the system. The preferred corrective measure is to modify the reticle. That is, the reticle can be modified to compensate for the lens error associated with that reticle. See, for instance, U.S. patent application Ser. No. 08/760,031, filed concurrently herewith, entitled "Reticle That Compensates For Lens Error In A Photolithographic System" by B. Moore et al., which is incorporated herein by reference.

Variations to the above embodiments are apparent. For instance, various test structures including masks, reticles, and other structures with radiation-transmitting and radiation-blocking elements can provide the test patterns. The test patterns may include various horizontal, vertical, and/or diagonal patterns. Various photosensitive materials (both positive and negative) can be used to capture the image patterns. Alternatively, the image patterns can be monitored by photosensitive detectors. Although the lens error typically increases with lens heating, this need not necessarily be the case. For instance, the lens heating may reduce an inherent lens error. Likewise, different regions of the lens may react differently to similar amounts of heating. The invention is well-suited for inspecting lens errors in a variety of optical projection systems.

Those skilled in the art will readily implement the steps necessary to provide the structures and methods disclosed herein, and will understand that the process parameters, materials, dimensions, and sequence of steps are given by way of example only and can be varied to achieve the desired result as well as modifications which are within the scope of the invention. Variations and modifications of the embodiments disclosed herein may be made based on the description set forth herein, without departing from the spirit and scope of the invention as set forth in the following claims.

What is claimed is:

1. A method of inspecting a lens in a photolithographic system for fabricating integrated circuit devices, the method comprising:

forming a first image pattern on a first portion of an image plane by projecting radiation through a first test pattern and the lens, wherein the first test pattern transfers a first amount of radiation to the lens thereby providing a first heating of the lens;

forming a second image pattern on a second portion of the image plane by projecting radiation through a second test pattern and the lens, wherein the second test pattern transfers a second amount of radiation to the lens thereby providing a second heating of the lens, and the second amount of radiation is greater than the first amount of radiation resulting in the second heating of the lens being greater than the first heating of the lens;

determining a first lens error associated with the first image pattern;

determining a second lens error associated with the second image pattern; and using the first and second lens errors to obtain image displacement data as a function of heating the lens.

2. The method of claim 1, wherein the first test pattern is provided by a first test reticle, and the second test pattern is provided by a second test reticle.

3. The method of claim 1, wherein the image displacement data is also a function of position on a surface of the lens.

4. The method of claim 1, wherein the first test pattern includes a first pattern of optically transparent lines with a first average spacing therebetween, the second test pattern includes a second pattern of optically transparent lines with a second average spacing therebetween, and the first average spacing is greater than the second average spacing, thereby causing the second amount of radiation to be greater than the first amount of radiation.

5. The method of claim 4, wherein the first test pattern consists of the first pattern of optically transparent lines, and the second test pattern consists of the second pattern of optically transparent lines.

6. The method of claim 5, wherein the optically transparent lines in the first and second test patterns have similar line widths.

7. The method of claim 1, wherein the first and second image patterns are formed in sequence.

8. The method of claim 1, wherein the image plane is a photosensitive material on a wafer.

9. The method of claim 8, further including:

forming the first image pattern on the photosensitive material using the first test pattern;

forming the second image pattern on the photosensitive material using the second test pattern;

etching the wafer using the photosensitive material as an etch mask to form a first transfer pattern and a second transfer pattern in the wafer, wherein the first transfer pattern corresponds to the first image pattern, and the second transfer pattern corresponds to the second image pattern;

stripping the photosensitive material;

measuring the first transfer pattern in conjunction with determining the first lens error; and measuring the second transfer pattern in conjunction with determining the second lens error.

10. The method of claim 9, wherein the wafer includes a polysilicon layer over a semiconducting substrate, and the first and second transfer patterns are formed in the polysilicon layer.

11. A method of inspecting a lens in a photolithographic system for fabricating integrated circuit devices, the method comprising:

depositing a photoresist on a wafer;

forming a first image pattern on a first portion of the photoresist by projecting radiation through a first test reticle and the lens, wherein the first test reticle includes a first test pattern of optically transparent lines that transfer a first amount of radiation to the lens thereby providing a first heating of the lens;

forming a second image pattern on a second portion of the photoresist by projecting radiation through a second test reticle and the lens, wherein the second test reticle includes a second test pattern of optically transparent lines that transfer second amount of radiation to the lens, thereby providing a second heating of the lens, wherein the second amount of radiation is greater than the first amount of radiation resulting in the second heating of the lens being greater than the first heating of the lens;

developing the photoresist;

etching the wafer using the photoresist as an etch mask, thereby forming a first transfer pattern in the wafer corresponding to the first image pattern and a second transfer pattern in the wafer corresponding to the second image pattern;

stripping the photoresist;

comparing the first test pattern with the first transfer pattern in conjunction with determining a first lens error;

comparing the second test pattern with the second transfer pattern in conjunction with determining a second lens error; and using the first and second lens errors to obtain image displacement data as a function of position along a surface of the lens and as a function of heating the lens.

12. The method of claim 11, further including measuring the first and second transfer patterns with a scanning electron microscope.

13. The method of claim 11, further including obtaining a focus-exposure matrix for the wafer, and then forming the first and second image patterns using information from the focus-exposure matrix.

14. The method of claim 11, further including:

forming multiple ones of the first image pattern on separate portions of the photoresist in step and repeat fashion;

forming multiple ones of the second image pattern on separate portions of the photoresist in step and repeat fashion;

etching the wafer to obtain multiple ones of the first and second transfer patterns;

measuring the multiple ones of the first and second transfer patterns; and using statistical analysis to determine the first and second lens errors.

15. The method of claim 11, wherein the position along the surface of the lens is expressed in terms of x and y coordinates, and for pairs of the x and y coordinates, the image displacement data includes a first x and y displacement corresponding to the first lens error, and a second x and y displacement corresponding to the second lens error.

16. The method of claim 11, wherein equal amounts of radiation are projected at the first and second reticles.

17. The method of claim 11, wherein the first amount of radiation is less than about 10 percent of the radiation projected at the first test reticle, and the second amount of radiation is greater than about 80 percent of the radiation projected at the second test reticle.

18. The method of claim 11, wherein the second test pattern consists of the second pattern of optically transparent lines which form a uniform, repeating pattern.

19. The method of claim 11, wherein the wafer includes a polysilicon layer over a semiconducting substrate, and etching the wafer includes etching the polysilicon layer to form the first and second transfer patterns in the polysilicon layer.

20. The method of claim 11, wherein the first and second test reticles include a chrome pattern on a quartz base.

21. A method of inspecting a lens, comprising:

projecting a first amount of radiation through a first test pattern and the lens to provide a first heating of the lens and a first lens error associated with the first heating of the lens;

projecting a second amount of radiation through a second test pattern and the lens to provide a second heating of the lens and a second lens error associated with the second heating of the lens, wherein the second amount of radiation is greater than the first amount of radiation which causes the second heating of the lens to be greater than the first heating of the lens; and using the first and second lens errors to provide image displacement data that varies as a function of heating the lens.

22. The method of claim 21, wherein providing the first lens error includes measuring a first transfer pattern resulting from projecting the first amount of radiation through the first test pattern and the lens, and providing the second lens error includes measuring a second transfer pattern resulting from projecting the second amount of radiation through the second test pattern and the lens.

23. The method of claim 22, further including:

projecting the first amount of radiation through the first test pattern to form a first image pattern on a first portion of a photosensitive material on a wafer;

projecting the second amount of radiation through the second test pattern to form a second image pattern on a second portion of the photosensitive material;

developing the photosensitive material to expose selected portions of the wafer; and etching the wafer using the photosensitive material as an etch mask thereby forming the first transfer pattern in the wafer and the second transfer pattern in the wafer, wherein the first transfer pattern corresponds to the first image pattern and the second transfer pattern corresponds to the second image pattern.

24. The method of claim 23, further including measuring the first and second transfer patterns with a scanning electron microscope.

25. The method of claim 21, wherein the first test pattern consists of spaced transparent first lines, the second test pattern consists of spaced transparent second lines, and an average spacing between the first lines is greater than an average spacing between the second lines.

26. The method of claim 25, wherein the second lines form a repeating pattern that extends in both the x and y directions.

27. The method of claim 25, wherein the spacing between the second lines corresponds to a minimum resolution of a photolithographic system that projects the first and second amounts of radiation.

28. The method of claim 21, wherein the image displacement data is also a function of position on the lens.

29. The method of claim 21, wherein projecting the first and second amounts of radiation through the first and second test patterns is performed in sequence.

30. The method of claim 21, wherein the lens is part of a photolithographic system for fabricating integrated circuit devices.

* * * * *

UNITED STATES PATENT AND TRADEMARK OFFICE
CERTIFICATE OF CORRECTION

PATENT NO. : 5,723,238
DATED : Mar. 3, 1998
INVENTOR(S) : Bradley T. Moore, et al It is certified that error appears in the above-identified patent and that said Letters Patent is hereby corrected as shown below:

Col. 2, line 42, delete the first occurrence of the word "a".
Col. 6, line 64, delete "shipped" and insert -- stripped --.
Col. 7, line 7, delete "shipped" and insert -- stripped --.

Signed and Sealed this

Twenty-ninth Day of December, 1998

Attest:

BRUCE LEHMAN

*Attesting Officer*     *Commissioner of Patents and Trademarks*